United States Patent
Bohn et al.

(10) Patent No.: US 12,336,112 B2
(45) Date of Patent: Jun. 17, 2025

(54) HIGH ASPECT RATIO VIAS FILLED WITH LIQUID METAL FILL

(71) Applicant: SAMTEC, INC., New Albany, IN (US)

(72) Inventors: Christopher David Bohn, New Albany, IN (US); Mark Crain, New Albany, IN (US); Justin Roehm, New Albany, IN (US); Thomas Jacob Hammann, Arvada, CO (US); Nathan Robertson, New Albany, IN (US); Jeremy Brown, New Albany, IN (US); Christopher Pelkey, New Albany, IN (US); Adam Owens, New Albany, IN (US); Russell Payton, New Albany, IN (US); Russell Frank, New Albany, IN (US)

(73) Assignee: SAMTEC, INC., New Albany, IN (US)

( * ) Notice: Subject to any disclaimer, the term of this patent is extended or adjusted under 35 U.S.C. 154(b) by 0 days.

(21) Appl. No.: 18/554,556

(22) PCT Filed: Apr. 11, 2022

(86) PCT No.: PCT/US2022/024275
§ 371 (c)(1),
(2) Date: Oct. 9, 2023

(87) PCT Pub. No.: WO2022/217146
PCT Pub. Date: Oct. 13, 2022

(65) Prior Publication Data
US 2024/0196540 A1  Jun. 13, 2024

Related U.S. Application Data

(60) Provisional application No. 63/301,425, filed on Jan. 20, 2022, provisional application No. 63/211,330,
(Continued)

(51) Int. Cl.
*H05K 3/00* (2006.01)
*H01L 21/48* (2006.01)
(Continued)

(52) U.S. Cl.
CPC ......... *H05K 3/0094* (2013.01); *H01L 21/486* (2013.01); *H01L 23/49827* (2013.01);
(Continued)

(58) Field of Classification Search
CPC ............ Y10T 29/49993; H05K 3/0094; H05K 3/426; H05K 2203/128
See application file for complete search history.

(56) References Cited

U.S. PATENT DOCUMENTS 3,561,110 A * 2/1971 Feulner ................ H01R 12/523
361/321.1
3,735,911 A * 5/1973 Ward ...................... H01L 24/81
228/19
(Continued)

FOREIGN PATENT DOCUMENTS

EP 1575084 B1 5/2010
WO 2007/089206 A1 8/2007
(Continued)

OTHER PUBLICATIONS

Spiess et al, "Via hole filling with gold melting by KrF excimer laser irradiation." J. Vac. Sci. Technol., Jan./Feb. 1989, pp. 127-128.

*Primary Examiner* — Sarang Afzali
(74) *Attorney, Agent, or Firm* — BakerHostetler (57) ABSTRACT

A substrate includes a substrate body made of a material such as glass, and at least one electrical via that extends at least into or through the substrate body. The via is metalized with a molten metal that enters the via under capillary action and solidifies to establish electrical conductivity through the via. The melting temperature of the metal is less than the
(Continued)

transition temperature and melting temperature of the substrate body.

18 Claims, 5 Drawing Sheets

Related U.S. Application Data filed on Jun. 16, 2021, provisional application No. 63/173,135, filed on Apr. 9, 2021.

(51) Int. Cl.
  *H01L 23/498* (2006.01)
  *H05K 1/11* (2006.01)
  *H05K 3/42* (2006.01)

(52) U.S. Cl.
  CPC ............ *H05K 1/115* (2013.01); *H05K 3/426* (2013.01); *H05K 2203/128* (2013.01); *Y10T 29/49993* (2015.01)

(56) References Cited

U.S. PATENT DOCUMENTS

| | | |
|---|---|---|
| 3,852,877 A * | 12/1974 | Ahn .................. H10N 97/00 |
| | | 156/89.18 |
| 4,412,642 A | 11/1983 | Fisher |
| 6,294,745 B1 | 9/2001 | Gruber |
| 6,765,779 B2 | 7/2004 | Stevenson et al. |
| 7,114,312 B2 | 10/2006 | Coppeta et al. |
| 7,276,787 B2 | 10/2007 | Edelstein et al. |
| 8,324,100 B2 | 12/2012 | Akram et al. |
| 8,653,384 B2 | 2/2014 | Tang et al. |
| 10,130,302 B2 | 11/2018 | Knickerbocker et al. |
| 10,755,998 B2 * | 8/2020 | Nomura .............. H01L 23/3121 |
| 2002/0139556 A1 | 10/2002 | Ok et al. |
| 2003/0060000 A1 | 3/2003 | Umetsu et al. |
| 2003/0213605 A1 | 11/2003 | Brendel et al. |
| 2008/0023530 A1 * | 1/2008 | Kemper ................. B23K 13/01 |
| | | 228/234.1 |
| 2008/0303163 A1 | 12/2008 | Liu et al. |
| 2009/0243756 A1 | 10/2009 | Stevenson et al. |
| 2010/0052107 A1 | 3/2010 | Bauer |
| 2011/0248184 A1 | 10/2011 | Shah |
| 2019/0304877 A1 * | 10/2019 | Mobley ................. H01L 23/481 |

FOREIGN PATENT DOCUMENTS

| | | |
|---|---|---|
| WO | 2009/153728 A1 | 12/2009 |
| WO | 2021/067330 A2 | 4/2021 |

* cited by examiner

HIGH ASPECT RATIO VIAS FILLED WITH LIQUID METAL FILL

CROSS-REFERENCE TO RELATED APPLICATIONS

This application is the National Stage Application of International Patent Application No. PCT/US2022/024275, filed Apr. 11, 2022, which claims priority to U.S. Patent Application Ser. No. 63/173,135 filed Apr. 9, 2021, U.S. Patent Application Ser. No. 63/211,330 filed Jun. 16, 2021, and U.S. Patent Application Ser. No. 63/301,425 filed Jan. 20, 2022, the disclosure of each of which is hereby incorporated by reference as if set forth in its entirety herein.

BACKGROUND

1. Technical Field

Embodiments described herein generally relate to filling vias in a substrate.

2. Other Technical Approaches

Thin glass or optically transparent dielectric substrates, such as fused silica/quartz, crystalline silicon, borosilicate, sapphire, or other dielectric substrates are created having a plurality of metallized vias that are metalized in such a manner as to create an electrical path. In the case of through vias, the electrical path extends from a first surface of the substrate to a second surface that can be opposite the first surface. The integrated circuit packaging industry refers to these substrates as interposers that can define electrical connections at opposed ends of the electrical vias. Vias fabricated into the interposer are typically very small, for example, from 5 μm to 100 μm in diameter and from 50 μm to 500 μm in depth from the first surface to the second surface. The number of vias per square centimeter may be in the hundreds or even thousands. Following the processing necessary to fabricate these vias the next step is to metalize the vias to provide for an electrically conductive pathway from one circuit plane or substrate to another.

Electrically conductive vias can be filed by copper (Cu) plating or electrically conductive pastes that contain Cu, glass frit, or both. Other approaches include introducing a molten metal into the substrate. However, such approaches include a protective layer on the substrate, thereby adding cost and complexity to the manufacturing process, and also producing a two-piece substrate structure.

Approaches for filling glass vias are described in U.S. Pat. No. 7,276,787, PCT Publication No. WO 2021/067330, U.S. Pat. Nos. 4,412,642, and 6,294,745, the disclosure of each of which is hereby incorporated by reference as if set forth in its entirety herein.

What is needed is an improved method for metallizing vias of a substrate, and the resulting substrates having metallized vias.

SUMMARY

In accordance with one example, a molten metal can at least partially fill empty or hollow vias of a substrate that extend at least into or through the substrate. The molten metal can fill at least approximately 30%, at least approximately 40%, at least approximately 50%, at least approximately 60%, at least approximately 70%, at least approximately 80%, at least approximately 90% or at least approximately 95% of the respective volumes of the vias. The metal can be a pure metal or can be a metal alloy as desired.

Thus, a method to produce a substrate with at least one via that is filled can include a step of filing, at least 30% to at least 95% of a volume of an unfiled via with a liquid metal or a molten metal. A method to produce a substrate with a molten metal-filled via can include a step of changing a contact angle of the substrate, with respect to the molten metal, to less than 90 degrees. A method to produce a substrate having a molten metal filled via can include a step of wetting an interior via sidewall of the via prior to adding molten metal or molten metal alloy into the via or into an unfilled volume of the via.

A method to produce a filled via substrate can include a step of providing a substrate that has a first melt or transition temperature and that defines at least one via. The method can further include a step of wetting an interior via sidewall of the at least one via with an adhesion liner. The method can further include a step of wetting any one or both of a first via opening and a second via opening opposed to the first via opening with the adhesion liner. The method can further include a step of adding an additional electrically conductive second layer on top of or over the adhesion liner. The method can further include a step of pre-heating the substrate. The method can further include a step of spraying or applying solder flux onto a first surface of the substrate. The method can further include a step of dipping or submerging the substrate into a bath of molten metal or a molten metal alloy, wherein the molten metal or molten metal alloy is at a second melt or liquid phase temperature that is numerically less than the first melt or transition temperature.

A substrate can include a first material with a first melting or transition temperature and at least one via. The at least one via can be filled with an electrically conductive material that flowed into the at least one via in a heated liquid or molten state. An unoccupied void in the at least one via can be filled with an electrically conductive material that flowed into the at least one via in a heated, liquid or molten state.

A substrate can include a first material with a first melt or transition temperature and at least one via. The at least one via can include a copper deposition, in addition to a fluid or heated or molten metal or metal alloy that entered into the at least one via by capillary action.

A substrate can include a first material with a first melt or transition temperature and at least one via. The at least one via can be filled at least 50% with a molten, electrically conductive material.

A substrate can include a first material with a first melt or transition temperature and at least one via. The at least one via can contain both a deposited electrically conductive material, such as one or both of an adhesion liner and a second layer, and a poured or molten or heated metal or metal alloy having a second liquid phase temperature that is less than the first melt or transition temperature.

A substrate can include a first material that defines at least one via, and a solid, continuous column of an electrically conductive material that (i) extends from a first via opening to an opposed second via opening and (ii) entered into the first via opening in a liquid state, and perhaps by capillary action.

A substrate can include a first material that defines at least one via having a length and a diameter. An aspect ratio of the length of the at least one via to the diameter of the at least one via can be at least approximately five. A cooled molten metal or metal alloy can fill at least 30% of the at least one via.

A substrate can include a metal preform or a preformed metal that is subsequently reflowed into a via defined in the substrate. The substrate can be a glass substrate, such as borosilicate, fused silica/quartz, sapphire, etc.

The above and other features, elements, characteristics, steps, and advantages of the present invention will become more apparent from the following detailed description of the embodiments of the present invention with reference to the attached drawings.

DETAILED DESCRIPTION

Figure 1:
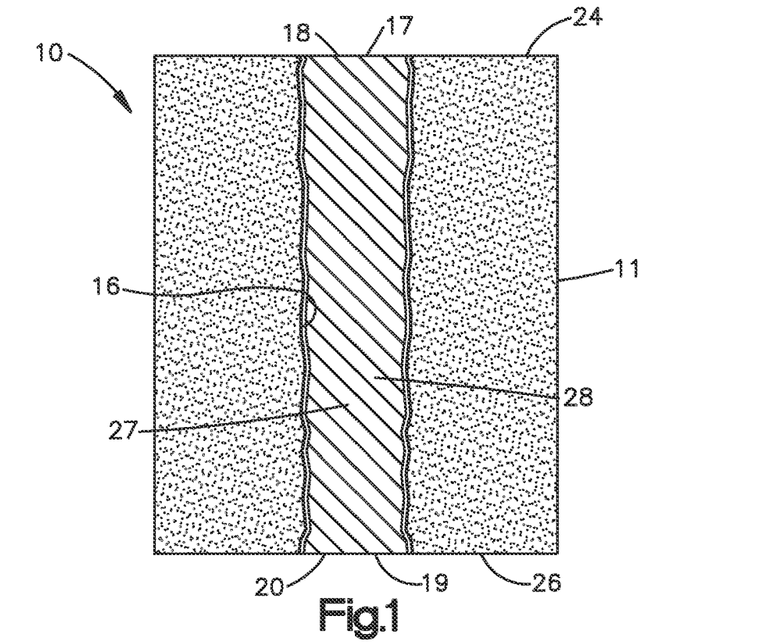
FIG. 1 is a cross-sectional view of a substrate with a via containing a solidified metal.
Figure 2:
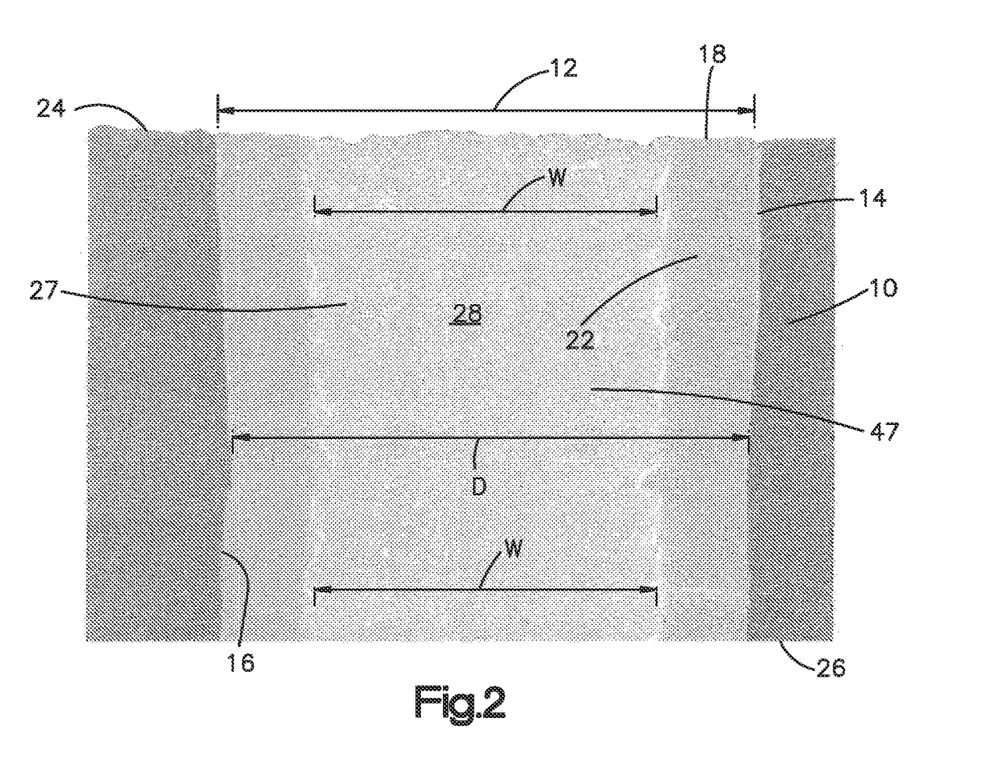
FIG. 2 is an enlarged cross-sectional view of a portion of the substrate shown in FIG. 1.

Referring initially to FIGS. 1-2, an electrically conductive substrate 10 can be configured for anatomical implantation, and is thus biocompatible. In one example, the electrically conductive substrate 10 can be configured as an interposer that is configured to establish electrical connection between a pair of electrical devices. The electrically conductive substrate 10 can include a monolithic substrate body 11. The substrate body 11, and thus the substrate 10, can define an external first outer surface 24 and an external second outer surface 26 that is opposite the first outer surface 24. The electrically conductive substrate 10 can further include at least one via 12 that extends from a first end 17 to a second end 19 opposite the first end 17. The via 12 can extend through the substrate body 11 from at least one of the first and second surfaces 24 and 26 toward or to the other of the first and second surfaces 24 and 26. Thus a first opening 18 of the via 12 can be defined in the first outer surface 24. A second opening 20 of the via 12 can be defined in the second outer surface 26. In one example, the via 12 can be configured as a through via (TV) that extends from the first outer surface 24 to the second outer surface 26. It should be appreciated, of course, that the via 12 can be configured in any suitable alternative manner as desired, such as a blind via having only a single opening to an outer surface of the substrate body 11. The substrate body 11 can define at least one inner surface 16 that defines the via 12. The inner surface 16 can extend from one of the first and second surfaces 24 and 26 toward the other of the first and second surfaces 24 and 26. For instance, the inner surface 16 can extend from the first surface 24 to the second surface 26.

The substrate body 11 can be a monolithic substrate body 11, meaning that the substrate body 11 can be homogenous from the first outer surface 24 to the second outer surface 26. The substrate body 11 can be made from any suitable material as desired, having a material transition temperature. The material can soften at the material transition temperature. The material can further define a material melting temperature at which the material melts. The material melting temperature can be higher than the material transition temperature. In one example, the material can be glass, such that the material transition temperature can be a glass transition temperature. In one example, the glass can be an optically transparent glass. The glass can be a borosilicate, fused silica/quartz, sapphire, or any suitable alternative glass material as desired. In some examples, the first and second outer surfaces 24 and 26 of the substrate body 11 also define the first and second outer surfaces of the substrate 10. Thus, in some examples the substrate body 11 does not support a protective layer or sacrificial layer on either of the first and second outer surfaces 24 and 26 both during fabrication of the substrate 10 and after fabrication of the substrate 10. Further, in some examples the substrate body 11 does not support a non-glass protective layer or sacrificial layer on either of the first and second outer surfaces 24 and 26 both during fabrication of the substrate 10 and after fabrication of the substrate 10.

The via 12 can include a metal 28 that can be in a solidified state so as to define a solid or solidified metal 27. The solidified metal 27 can extend continuously between the first surface 24 and the second surface 26 so as to define an electrically conductive path between the first surface 24 and the second surface 26. In one example, the solidified metal 27 can extend continuously from the first surface 24 to the second surface 26. Thus, the solidified metal 27 can define an electrically conductive path from the first surface 24 to the second surface 26. In some examples, the solidified metal 27 does not extend beyond either or both of the first and second surfaces 24 and 26. For instance, the solidified metal 27 can terminate at each of the first surface 24 and the second surface 26. The solidified metal 27 in the via 12 is in a solid state, also referred to as a solidified metal. As will be appreciated from the description below, during fabrication of the substrate 10, the metal 28 can be melted to a molten state to produce a molten metal 31, for instance in an oven 29. The molten metal 31 can flow (e.g., can be pulled) into the via 12 by capillary action (see FIGS. 3B-3C), and can be subsequently solidified so as to define the solidified metal 27 shown at FIG. 3D. The molten metal 31 can flow into the via 12 by capillary action according to Euler's equation. Because the substrate 10 does not include a protective or sacrificial layer, the molten metal 31 only enters the vias 12 that extend through the substrate body 11 during capillary action, and does not fill other vias that are not defined by the substrate body 11.

Figure 4A:
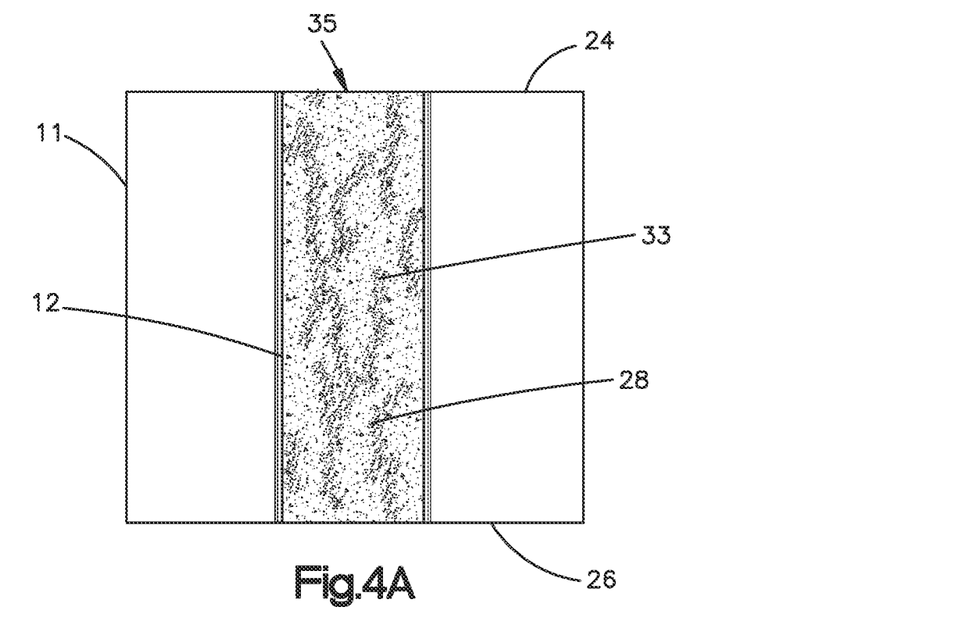
FIG. 4A is a cross-sectional side view of the substrate including powdered metal disposed in a via in accordance with another example.
Figure 4B:
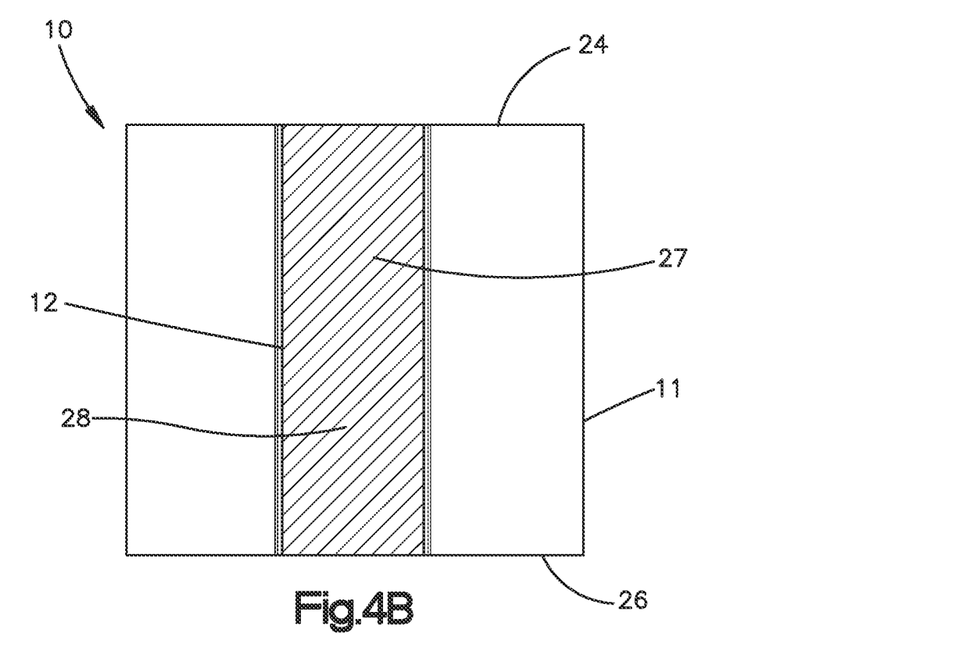
FIG. 4B is a cross-sectional side view of the substrate of FIG. 4A after the powdered metal has been melted and subsequently solidified.

In other examples, as shown at FIGS. 4A-4B, the vias 12 can be alternatively filled by introducing a dry metal powder 33 into the via 12, and then subsequently liquifying or melting the metal powder 33 contained within the via 12 using any suitable heat source as desired. For instance, the ambient temperature can be increased in the oven 29 of FIG.

Figure 5:
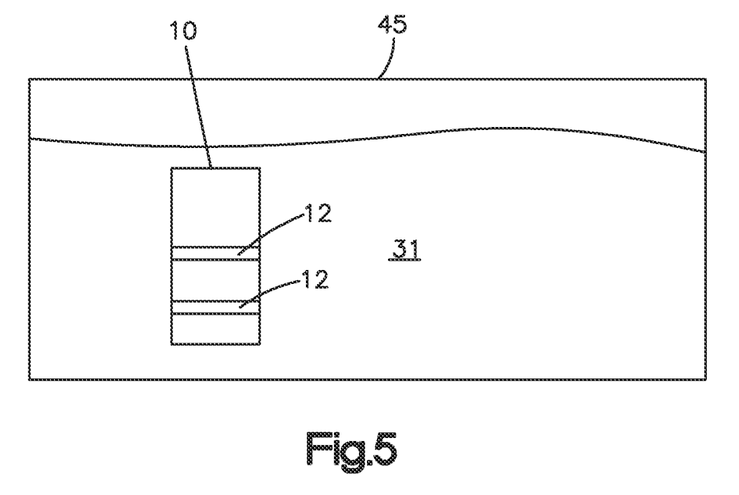
FIG. 5 is a schematic view showing a substrate placed in a bath of molten metal so as to draw the molten metal into the vias of the substrate.

3A. Alternatively, inductive inductive/induction heating, such as RF/Eddy currents 35, can liquefy or melt the powder, which causes the metal 28 to melt and subsequently solidify to define the solidified metal 27 (see FIGS. 4A-4B). The via 12 of FIGS. 4A-4B can include the adhesion layer 14 applied to the inner surface 16, and the wetting liner 22 applied to the adhesion layer 14 as described above. Alternatively, the via 12 can include the adhesion layer 14 but not the wetting layer 22, such that the solidified metal 27 bears directly against the adhesion layer 14. Alternatively still, the via 12 can be devoid of each of the adhesion layer 14 and the wetting layer 22, such that the solidified metal 27 bears directly against the inner surface 16. In still other examples, as shown in FIG. 5, the substrate 20 can be placed into a bath 45 of molten metal 31, and removed from the bath 34 such that the molten metal 31 on either or both of the first and second surfaces 24 and 26 can metallize the vias 12 via capillary action. Alternatively, the substrate 20 can be placed into the bath 34 such that the molten metal 31 fills the via 12 while the substrate is disposed in the bath 34. For instance, the molten metal 31 of the bath 34 is disposed on both sides of the via 12 simultaneously. Alternatively still, the substrate 20 can be placed in the bath 34 such that the molten metal 31 is disposed on only one side of the via 12. The molten metal 31, the dry metal powder 33, and thus the solidified metal 27 can be any one or more of copper, silver, gold, platinum, aluminum, palladium. In some examples, the metal can be a pure metal, meaning that the metal is not alloyed with other metals. In other examples, the metal can be an alloy.

In general, and without being bound by theory, the present inventors have found that the substrate body 11 made from one or more materials with high melting points, such as crystalline Si (melting temperature (Tm)=1414 degrees C.), Al2O3 (Tm=2040 degrees C.), glasses such as fused silica (glass transition temperature (Tg)=1200 degrees C.), borosilicate (Tg=525 degrees C.). The substrate body can alternatively be a ceramic among certain ceramics that can receive and successfully tolerate certain molten metals. The term successfully tolerate can mean that the substrate body 11 does not melt or transition or crack during exposure to the molten or liquid metal. Although molten metals are disclosed, this disclosure also contemplates conductive inks and other electrically conductive carbons, metals and alloys that are liquid at ambient temperatures or temperatures not exceeding 475 degrees Celsius. The term "ambient temperature" can refer to a temperature range from approximately 20 degrees Celsius to approximately 40 degrees Celsius.

The term "approximately," "substantially," and the like along with derivatives thereof are intended to mean considerable in extent or largely but not necessarily wholly (but can include wholly) that which is specified. As used herein, the term "substantially," "approximately," derivatives thereof, and words of similar import, when used to describe a size, shape, orientation, distance, spatial relationship, or other parameter includes the stated size, shape, orientation, distance, spatial relationship, or other parameter, and can also include a range up to 10% more and up to 10% less than the stated parameter, including 5% more and 5% less, including 3% more and 3% less, including 1% more and 1% less.

One method of metallizing the via 12 can include the step of selecting or providing a substrate body 11 made from a first material. The substrate body 11 or first material can have a first melting or glass transition temperature (or first material melting or glass transition temperature) that is numerically higher, in degrees Celsius, than a second or melting or liquid phase temperature (or metal melting or liquid phase temperature), measured in degrees Celsius, of the metal to be introduced into the via 12. The metal can be a non-suspension in some examples. The reverse is also true, such that the second melting or liquid phase temperature is less than the first or melting or glass transition temperature. Another aspect or step can include selecting or providing a metal to be introduced into the via 12, whereby the metal has a second or melting or liquid phase temperature, in degrees Celsius, that is numerically less than a first or melting or glass transition temperature, in degrees Celsius, of the corresponding substrate body 11. Thus, heating the metal and the substrate body 11 to the melting or liquid phase temperature of the metal does not damage the substrate body 11. In general, the substrate body 11 should not disintegrate or melt when the molten metal or metal alloy is in physical contact with the substrate, or when the substrate body 11 and metal are subjected to a temperature sufficient to cause the metal to melt or enter its liquid phase. In this regard, it should be appreciated that at least a portion up to an entirety of the substrate body 11 can be heated to a temperature greater than room temperature when the molten metal 31 flows into the via 12. In some examples, at least a portion up to an entirety of the substrate body 11 can be heated to a temperature greater than approximately 120 degrees Celsius room temperature when the molten metal 31 flows into the via 12.

Referring to FIGS. 1-3D generally, it should be appreciated that the molten metal 31 can be at a temperature less than the glass transition temperature or melting temperature of the substrate body 11. For instance, the molten metal 31 can be at a temperature greater than approximately 90 degrees Celsius but at or below 1000 degrees Celsius, above 150 degrees Celsius but at or below 1000 degrees Celsius, above 250 degrees Celsius but at or below 1000 degrees Celsius, above 350 degrees Celsius but at or below 1000 degrees Celsius, above 100 degrees Celsius but at or below 500 degrees Celsius, above 90 or 100 degrees Celsius but at or below 1500 degrees Celsius, above 250 degrees but at or below 1500 degrees Celsius, and above 350 degrees Celsius but at or below 1500 degrees Celsius. In some example, the molten metal 31 can flow into the via 12 at a temperature greater than approximately 280 degrees Celsius but less than the glass transition temperature of the substrate body 11. In other examples, the temperature of the molten metal 31 can be in a range from approximately 280 C to approximately 1064 C. In particular, the temperature of the molten metal 31 can be in a range from approximately 700 C to approximately 1061 C. The molten metal 31 and the powdered metal 33, and thus the solidified metal 27, can be devoid of frit, glass frit, alcohol, and isopropyl alcohol. The molten metal 31 and the powdered metal 33, and thus the solidified metal 27, can further be devoid of tin or solder flux.

When fabricating the electrically conductive substrate 10, it is desirable to cause the metal 28 to enter the via 12 such that the solidified metal 27 defines an electrically conductive path between the first surface 24 (or first opening 18) and the second surface 26 (or second opening 20). For instance, the solidified metal 27 can define the electrically conductive path from the first surface 24 (or first opening 18) to the second surface 26 (or second opening 20). Thus, in some examples, it is desirable to cause the molten metal 31 to flow all the way through each via 12, such as from the first via opening 18 to the end of a blind via or to the opposed second opening 20. A typical contact angle for molten or liquid metals or molten metal alloys on oxide, nitride and carbide substrates is greater than 90 degrees, which results in a negative capillary height. In turn, a negative capillary height impedes the flow of a molten metal/metal alloy into the corresponding via. The present inventors have found that an adhesion layer or liner 14 can be applied to the inner surface 16, and a second electrically conductive layer or liner, which can define a wetting layer or liner 22, can be applied to the adhesion layer 14, to provide a contact angle less than 90 degrees. The metal 18 can subsequently be inserted into the via 12.

The adhesion layer 14 can extend along an entirety of the length of the via 12. Thus, in one example, the adhesion layer 14 can extend from the first surface 24 to the second surface 26. The adhesion layer 14 can electroplated, applied by atomic layer deposition (ALD), chemical vapor deposition (CVD) or physical vapor deposition (PVD). The adhesion layer 14 can be electrically conductive. For instance, the adhesion layer 14 can be made of titanium, either as pure titanium or a titanium alloy. The titanium can be deposited to the inner surface 26 using physical vapor deposition. In other examples, the adhesion layer 14 can be made of tantalum, either as pure tantalum or a tantalum alloy such as tantalum nitride. The tantalum can be deposited to the inner surface 26 using atomic layer deposition. physical vapor deposition. The adhesion layer 14 can be devoid of tin or solder flux as desired. In other examples, the adhesion layer 14 can be electrically nonconductive.

The wetting liner 22 can be applied to the adhesion layer 14, such that the adhesion layer 14 is disposed between the inner surface 16 and the wetting liner 22. Thus, the adhesion layer 14 can adhere the wetting liner 22 to the inner surface 16. The adhesion layer 14 and the wetting liner 22 can extend along at least a portion, such as a majority up to an entirety of the length of the via 12. For instance, the wetting liner 22 can extend from the first surface 24 to the second surface 26. As is described in more detail below, the substrate body 11 and/or the wetting liner 22 can define a desirable contact angle with the molten metal 31 to facilitate the capillary action of the molten metal 31 as the molten metal 31 travels into the via 12. The wetting liner 22 can be copper, either as pure copper or as a copper alloy. Alternatively, the wetting liner 22 can be gold, either as pure gold or as a gold alloy. Thus, the wetting liner 22 can be the same material as the metal 28 that defines the electrically conductive path in the via 12. The wetting liner 22 can be devoid of tin or solder flux in some examples. The wetting liner 22 can be applied to the adhesion layer 14 by electroplating, atomic layer deposition (ALD), chemical vapor deposition (CVD) or physical vapor deposition (PVD). The wetting liner 22 can be electrically non-conductive in some examples as desired. The adhesion layer 14, and the wetting liner 22, can be applied onto all exposed surfaces of the substrate body 11, including the inner surfaces 16 that define the respective vias, and first and second via openings 18 and 20, respectively. Application of the adhesion layer 14 and the wetting liner 22 may also cause some of the adhesion layer material and wetting liner material to be applied to either or both of the first and second surfaces, but can be removed by polishing or alternative method as desired.

Start of Example 1:

As shown in FIGS. 1-2, a wafer or substrate 10 can include a substrate body 11 of a first material, such as fused silica for example. The substrate 10 can include at least one via or a plurality of vias 12 that extend through the substrate body 11. The vias 12 can be pre-drilled or pre-etched or otherwise pre-formed vias. The vias 12 can be configured as through vias, blind vias, or both that each define a respect empty volume. A through via can extend from the first surface 24 of the substrate body 11 to the second surface 26. A blind via can extend from one of the first and second surfaces 24 and 26, and terminates within the substrate body 11 so as to not extend to the other of the first and second surfaces 24 and 26.

One, two, two or more, three or more, or four or more vias 12 can have high aspect ratios, measured as a ratio of via length divided by a maximum cross-sectional dimension of the vias 12. Each via 12 can extend along a central axis along its length. When the via 12 is a through via, the central axis, and thus the length, can extend from the first surface 24 to the second surface 26. The cross-sectional dimension can be measured in a direction perpendicular to the central axis. When the via 12 is substantially cylindrical, the maximum cross-sectional dimension of the via 12 can be a diameter D of the via 12. The aspect ratio can be any one of approximately five, approximately six, approximately seven, approximately eight, approximately nine, approximately ten, or any suitable alternative ratio as desired. The via 12 can define any suitable aspect ratio as desired, it having been found by the present inventors that greater aspect ratios can increase the capillary action of the molten metal as the molten metal flows into the via 12. A molten metal can undergo increased flow under capillary action into at least one via 12 can be positioned in the at least one via 12 with increasing aspect ratios.

The diameter or other cross-sectional dimension can be substantially constant at each of the first opening 18 or the first surface 24 and the second opening 20 or the second surface 26. In examples whereby the via 12 is substantially cylindrical, the diameter or other cross-sectional dimension can be substantially constant from the first opening 18 or the first surface 24 to the second opening 20 or the second surface 26. In other examples, the via 12 can be hourglass shaped, whereby the diameter or other cross-sectional dimension is less at a location between the first and second surfaces 24 and 26 is less than the diameter or other cross-sectional dimension at either or both of the first and second openings 18 and 20, and thus at either or both of the first and second surfaces 24 and 26.

Vias 12 fabricated into the substrate body 11 are typically very small. The length and maximum cross-sectional dimension are measured in um (microns). The vias 12 can have a maximum cross-sectional dimension in a range from approximately 5 µm to approximately 100 µm in diameter. In other examples, the maximum cross-sectional dimension can be in a range from approximately 40 µm to approximately 3 mm. Thus, one or more vias 12 can have a via diameter of approximately 40 µm (microns). In another example, the vias can have any diameter in a range from approximately 41 µm (microns) to approximately 3000 µm (microns). The vias 12 can in a range from approximately 50 µm to approximately 500 µm along a central axis. The substrate 10 can include any number of vias 12 at any suitable density as desired. For instance, the substrate 10 can include a number of vias 12 per square centimeter in the tens, hundreds, or even thousands. Each of the vias 12 can be fabricated in the manner described herein.

The electrically conductive substrate 10 can include the adhesion layer 14 that is deposited or otherwise applied to the inner surface 16, and a wetting liner 22 that is deposited or otherwise applied to the adhesion liner 14 in the manner described above. The adhesion layer 14 can be approximately 5000 Ångstroms thick in one example. The adhesion liner 14 can be a titanium alloy such as titanium-tungsten (TiW). The adhesion liner 14 can be electrically conductive. Next, the wetting layer 22 can be applied to the adhesion liner 14 in the manner described above. In one example, the wetting layer 22 can have a thickness from approximately 1 um to approximately 6 um. The wetting layer 22 can be a layer of copper. Alternatively, the wetting layer 22 can include one or more of silver, gold, platinum, aluminum, palladium, nickel, titanium, chromium, in their pure forms or as alloys thereof. Although optional, the substrate body 11 can then be chemically mechanically polished (CMP) to remove the adhesion liner 14 and the wetting layer 22 that may have been deposited onto the first and second surfaces 24 and 26. Alternatively, either or both of the first and second surfaces 24 and 26 can be masked during the application of the adhesion liner 14 and the wetting layer to prevent deposition on to the first and/or second surfaces 24 and 26.

The substrate 10 can then be pre-heated, such as with an infrared (IR) lamp. A solder flux can be sprayed on the first and second surfaces 24 and 26 if desired. Otherwise, the substrate 10 can be devoid of solder flux or tin. The substrate 10 can then be dipped into a bath 45 of molten metal 31 in the manner described above (see FIG. 5). The molten metal 31 can be configured in any manner described above, or can alternatively be SAC305, Sn96.5Ag3Cu0.5 liquid solder, which has a lower melting point than the material of the substrate body 11. It should be appreciated that when the substrate 10 is placed in the bath 45, the molten metal 31 can physically contact either or both of the first and second surfaces 24 and 26, and a quantity of the molten metal 31 of the bath 45 flows into the vias 12 toward the other of the first and second surfaces 24 and 26.

The molten metal 31 can be drawn into the at least one via 12 by capillary action or solely by capillary force or action. In one example, the molten metal 31 can travel in the via 12 from the first surface 24 or first opening 18 toward the second surface 26 or second opening 20 via capillary action. For instance, the molten metal 31 can travel from the first surface 24 or first opening 18 to the second surface or second opening 20. Alternatively or additionally, the molten metal 31 can travel in the via 12 from the second surface 26 or second opening 20 toward the first surface 24 or first opening 18 via capillary action. For instance, the molten metal 31 can travel from the second surface 26 or second opening 20 to the first surface or first opening 18. To the extent that a quantity of solidified metal 27 can remain on either of the first and second surfaces 24 and 26 once the substrate 10 is removed from the bath 45, the fabrication method can include the step of removing the excess solidified metal 27 from the first and second surfaces 24 and 26, such as by chemically mechanically polishing (CMP) or any suitable alternative method as desired.

Once the substrate 10 and the re-solidified solder or other metal or metal alloy contained in the at least one via 12 cools, the at least one via 12 can be filled, in order of decreasing volume, with cooled or solidified molten metal/metal alloy 28, the second layer 22, and the adhesion liner 14. The same process applies to the rest of the plurality of vias 12.

As shown in FIG. 1, the cooled and solidified metal 27 can define, in cross-section, a column that extends along a majority length of at least one via 12, from the first via opening 18 to the second via opening 20. The column can have a relatively uniform cross-sectional width W along the majority length, which can define a diameter or any suitable alternative cross-sectional dimension. The solidified metal 27 can extend, from the first via opening 18 toward the second via opening 20, into one of at least 30%, at least 40%, at least 50%, at least 60%, at least 70%, at least 80%, at least 90%, and approximately 100% of the distance in the via 12 from the first surface 24 to the second surface 26. Alternatively or additionally, the solidified metal 27 can extend, from the second via opening 20 toward the first via opening 18, any one of at least 30%, at least 40%, at least 50%, at least 60%, at least 70%, at least 80%, at least 90%, and approximately 100% of the distance in the via 12 from the second surface 26 toward the first surface 24. The solidified metal 27 can occupy at least 50% of a total volume of the via. Thus, the solidified metal 27 can form the majority of electrically conductive fill in the at least one via 12.

End of Example 1.

In accordance with certain examples, through vias having high aspect ratios, such as high aspect ratio through silicon vias (TSVs) or through glass vias (TGVs) can be filled with a non-porous electrically conductive metal 28 in the molten phase using capillary force in a single, rapid, scalable step. Because capillary forces increase as the via diameter decreases, this method favorably scales with shrinking interposer and chip sizes.

One method of filling the via with the metal 28 will now be described with respect to FIGS. 3A-3D. In particular, at least one quantity 51 of the metal 28 in solid form can be placed against (i.e., in physical contact with) either or both of the first and second surfaces 24 and 26 in a position at least partially aligned with at least one of the vias 12. For instance, the quantity 51 can be fully aligned with the at least one of the vias 12. Thus, the at least one quantity 51 can fully cover at least one of the first opening 18 and the second opening 20 of the respective at least one via 12. Each quantity 51 of the metal 28 can be configured as a preformed mass 30 of metal 28 sized to cover the respective at least one of the vias 12. In one example, the preformed mass 30 of metal 28 covers only a respective single via 12. Each preformed mass 30 can be melted, which causes the metal 28 of the preformed mass 30 to flow or be pulled into the via 12 by capillary action from the respective first and/or second surface toward the other of the first and second surface in the via 12. In other examples, at least one preformed mass 30 can be sized to cover a respective plurality of the vias 12, such that when the preformed mass 30 is melted, the metal 28 of the preformed mass melts and flows by capillary action into each of the respective plurality of vias.

Figure 3A:
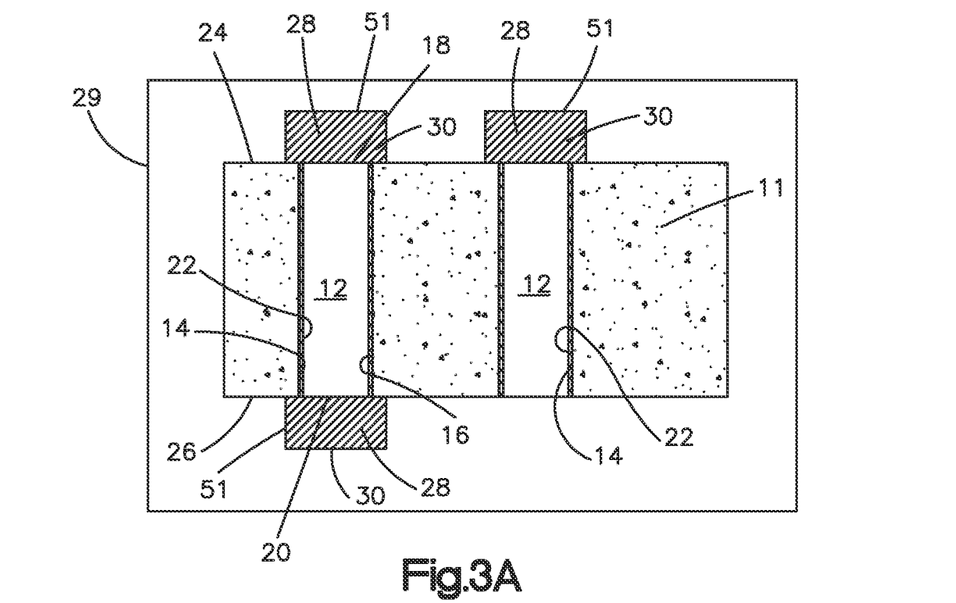
FIG. 3A is a cross-sectional side view of a substrate including a substrate body and a pair of vias that extend through the substrate body, showing preformed masses of solid metal disposed on the substrate body.
Figure 3B:
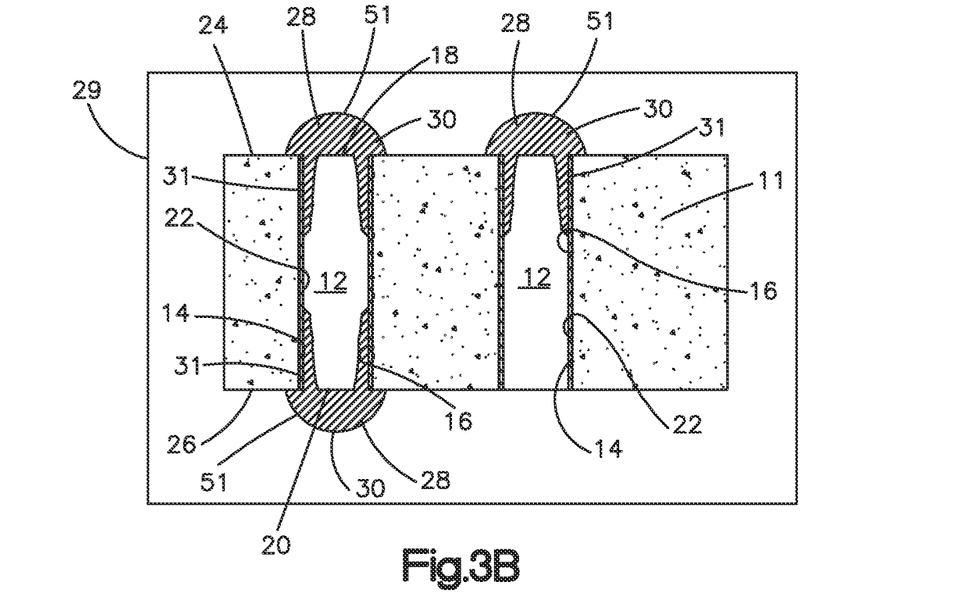
FIG. 3B is a cross-sectional side view of the substrate of FIG. 3A, showing the metal transformed into a molten metal that flows into the via.

When the preformed mass 30 covers only one of the openings 18, 20 of the via 12, then each preformed mass 30 can have a sufficient quantity of metal to fill the via 12 with the solidified metal 27 to the extent desired. When first and second preformed masses 30 cover the first and second openings 18 and 20 of the via 12, the first and second preformed masses 30 can combine to have a sufficient quantity of metal 28 that fills the via with the solidified metal 27 to the extent desired.

The at least one via 12 can be pre-coated or uncoated and can define a void that extends fluidly between the two opposed, open ends 17 and 19 of the at least one via 12. The substrate 10 can include at least one via 12 that can further include the wetting layer 14 and the adhesion layer 22 as described above. In one example, the substrate body 11 and the at least one preformed mass 30 can be heated simultaneously. For instance, the substrate body 11 and the at least one preformed mass can be placed in the oven 45, and the oven 45 can be heated to a heated temperature greater than the melting temperature of the preformed mass 30 and less than the transition temperature and melting temperature of the substrate body 11. Thus, the heated temperature is sufficient to transition the metal 28 of the preformed mass 30 from the solid state to the molten state. The resulting molten metal 31 flows into the via 12 under capillary action. In particular, the molten metal 31 from any preformed mass 30 at the first surface 24 flows into the via 12 from the first surface 24 toward or to the second surface 26. Similarly, the molten metal 31 from any preformed mass 30 at the second surface 26 flows into the via 12 from the second surface 26 toward or to the first surface 24. It should thus be appreciated that all preformed masses 30 can be melted simultaneously so as to correspondingly cause metal 28 to flow into the vias 12 simultaneously. The molten metal 31 can subsequently be cooled to a temperature less than the melting temperature of the metal 28, which causes the molten metal 31 to solidify and define the solid metal 27 as described above and shown at FIG. 3D.

Figure 3C:
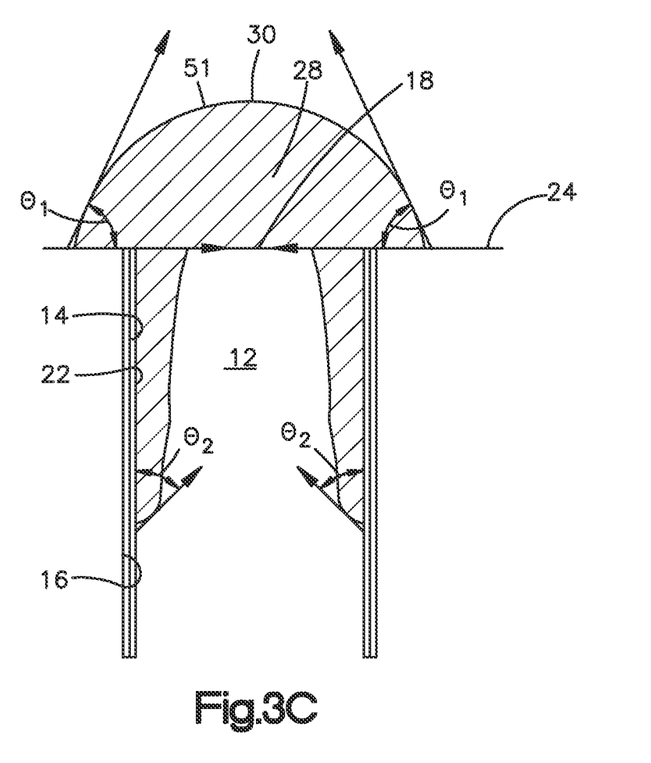
FIG. 3C is an enlarged portion of the cross-sectional side view of FIG. 3B showing a contact angle of the molten metal and an outer surface of the substrate body.

As shown at FIG. 3C, the molten metal 31 can define a first contact angle θ1 with respect to the respective first surface 24 or second surface 26. In particular, as the metal 28 is melted to define the molten metal 31, the molten metal 31 can tend to form a sphere under surface tension, which can create a contact angle greater than 90. However, as the molten metal 31 travels along the wetting liner 22, the molten metal deviates from the spherical shape so as to define the first contact angle θ1, which can be measured as an angle defined by the inner surface of the first surface 24 or the second surface 26 and a straight line tangent to the molten metal 31 at an interface between an outer surface of the molten metal 31 and the first or second surface 24, 26. The term "first" contact angle refers to a location of a contact angle, measured along the first and/or second surface 24, 26. It does not necessarily imply that all first contact angles θ1 are the same. For instance, the first contact angle θ1 at one side of the molten metal 31 on the first or second surface 24,26 can be the same or different than the first contact angle θ1 at another side of the molten metal on the first or second surface 24, 26. Thus, the molten metal 31 outside of the via 12 is pulled to flow into the via 12 under capillary action. The molten metal 31 can contact the first or second surface 24, 26 directly prior to flowing into the via 12 in one example. Alternatively, the adhesive layer 14 and wetting liner 22 can be applied to the first and second surfaces 24 and 26 as desired, and subsequently removed by chemically mechanically polishing (CMP).

The molten metal 31 can further define a second contact angle θ2 with respect to the wetting liner 22 in the via 12. In particular, as the molten metal 31 travels along the wetting liner 22, the molten metal deviates from a spherical shape so as to define the second contact angle θ2, which can be measured as an angle defined by the inner surface of the wetting liner 22 and a straight line tangent to the molten metal 31 at an interface between an outer surface of the molten metal 31 and the wetting liner 22 inside the via 12. The term "second" contact angle refers to a location of a contact angle, measured along the wetting liner of the via 12. It does not necessarily imply that all second contact angles θ2 are the same. For instance, the second contact angle θ2 at one side of the via 12 can be the same or different than the second contact angle θ2 at another side of the via 12. The contact angles θ1 and θ2 can be less than 90 degrees, which creates a positive capillary height that enhances the flow of the molten metal 31 into the respective via 12.

In another example, one or more of the preformed masses 30 can be selectively melted without bringing an entirety of the substrate body 11 to the melting temperature of the metal 28. For instance the preformed mass 30 can be subjected to RF waves 35 (see FIG. 4A) to induce Eddy currents in the preformed masses 30 and melt the corresponding metal 28, which thereby causes the resulting molten metal 31 to flow under capillary action into the respective at least one via 12. The liquid or melted metal/metal alloy preforms or preformed metal/metal alloy 30 can be pulled into the at least one via 12 by capillary forces and then cooled or allowed to cool as desired.

Figure 6:
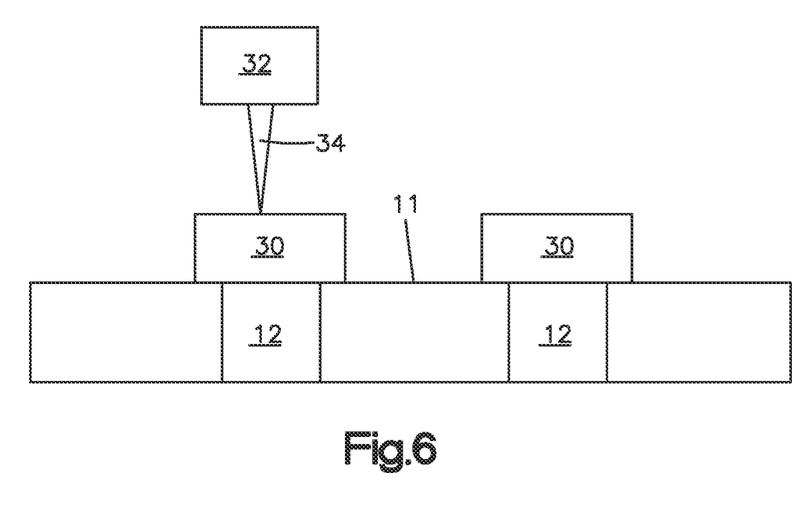
FIG. 6 is a cross-sectional side view of heating a metal or metal alloy using an excitation device, such as a laser.

Referring now to FIG. 6, as another alternative, the preformed mass 30 can be selectively heated or reflowed using an excitation device 32, source, or method. The excitation device 32 can be configured as a laser that directs a laser beam 34 to the preformed mass 30. One or more laser beams 34 can be directed to a respective one or more preformed masses 30 simultaneously as desired in order to simultaneously cause molten metal 31 to simultaneously flow into the respective vias 12 under capillary action. Excitation reflow or laser reflow can be advantageous in situations where it is preferred not melt the metal 28 of the preformed masses 30 without heating or baking the entire substrate body 11, or without simultaneously heating or baking both sides 24 and 26 of the substrate body 11.

Thus, a method to fill at least one via 12 in the glass substrate 10, such as a glass substrate, can include any one or more of the steps of providing the glass substrate 10, positioning one or more preformed masses 30 onto either or both of the first and second surfaces 24 and 26. The preformed masses 30 can be placed adjacent a respective one or more of the first and second openings 18 and 20 with or without solder flux, such as by a pick and place machine. The method can include the step of selectively applying an excitation device, such as a laser beam, to the preformed masses 30 sufficient to cause the solid metal 28 to reach a melting temperature that causes the solid metal to melt and define molten metal, which causes the metal to flow from either or both of the first and second surfaces 24 and 26 toward the other of the first and second surfaces 24 and 26 under capillary action. Advantageously, the excitation device or laser beam can melt one or more preformed masses 30 without directing the excitation device or laser beam at an entirety of the substrate body 11. Thus, at least a portion of the substrate body 11 does not receive the excitation device or laser beam in some examples.

Referring again to FIG. 3D, methods and apparatus have been described herein for producing the substrate 10 having a substrate body 11 and a plurality of vias 12 that extend into or through the substrate body 11 that have been metalized with a molten metal that has flowed into the via under capillary action. In some examples, the metal of the molten metal was previously a solid metal in contact with the substrate body 11 that was then subsequently melted to define the molten metal. Once the via 12 has been suitably filled with the desired quantity of metal 28, the metal 28 can be cooled to produce the solid metal 27. The method can further include the step of polishing either or both of the first and surfaces 24 and 26, for instance using CMP, to remove excess of the solidified metal 27 from the either or both of the first and second surfaces 24 and 26.

Figure 3D:
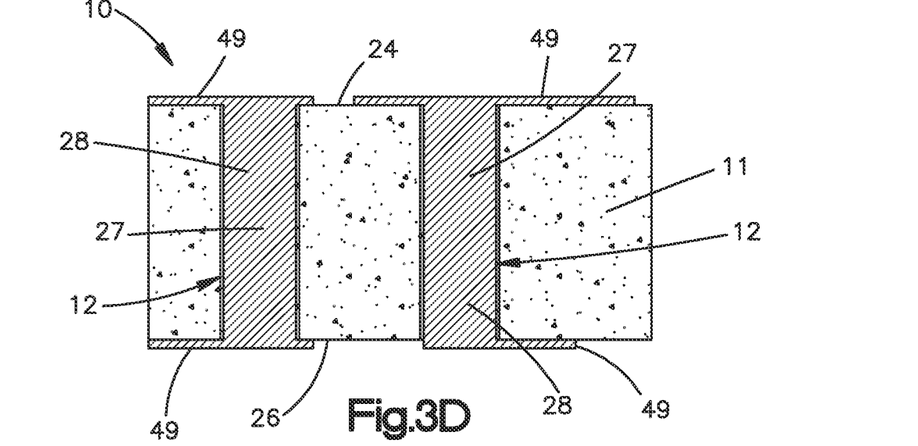
FIG. 3D is a cross-sectional side view of the substrate of FIG. 3B, after a molten metal has flowed into the vias and solidified, wherein the substrate includes redistribution layers.

With continuing reference to FIG. 3D, the method can further include the step of applying one or more redistribution layers 49 to either or both of the first and second surfaces 24 and 26 after the vias 12 have been metallized. The redistribution layers 49 can be applied so that they are in electrical contact with at least one of the vias 12. The redistribution layers 49 can route electrical signals as desired. It should further be appreciated that the substrate 10 can include one or more contact pads that are directly disposed on the first and second surfaces 24 and 26. The redistribution layers 49 and the contact pads can be made of a different material than the metal 28. Alternatively the redistribution layers 49 and the contact pads can be made of the same material as the metal 28. Thus, the substrate 10 can be configured as an interposer that makes electrical contact with complementary electrical devices that are placed in electrical communication with the first and second surfaces 24 and 26 of the substrate 10, and thus with each other through at least one of the vias. In this regard, the substrate 10 can define an interposer and does not define a semiconductor device.

Referring again to FIG. 1, it is appreciated that the solid metal 27 can define voids in the via 12. The via 12 can include a fill material that is introduced into the vias 12 to fill at least some up to all of the voids. The fill material can be a polymer in one example. The fill material can include or be a glass frit, which can be a lead-free glass frit, a polymer, other suitable material, or any combination thereof. The solid metal 27 and/or the fill material 47 can hermetically seal the at least one via 12.

Any proceeding methods or structure can be incorporated into the preform/preformed embodiments described herein.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device, or component thereof to the teachings of the disclosure without departing from the essential scope thereof. Therefore, it is intended that the disclosure is not limited to the particular embodiments disclosed for carrying out this disclosure, but that the disclosure will include all embodiments falling within the scope of the appended claims.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. Conversely, description of the plural forms are intended to apply with equal force and effect to the singular forms as well, unless the context clearly dictates otherwise. The term "at least one" is intended to include the singular form as well as the plural forms. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

We claim:

1. A method of metallizing a monolithic substrate body, the method comprising the steps of:
   physically contacting a metal with a first surface of the monolithic substrate body opposite a second surface of the monolithic substrate body, wherein the metal comprises gold or a gold alloy, and the monolithic substrate body comprises sapphire;
   causing a quantity of the metal in a molten state to flow via capillary action from the first surface toward the second surface of the monolithic substrate body in a via that extends along a centerline from the first surface to the second surface, so as to define a contact angle between the metal in the molten state and a metallic wetting liner, wherein the contact angle is less than 90 degrees; and
   solidifying the metal in the molten state in the via to produce a solidified metal that defines an electrically conductive path between the first surface and the second surface,
   wherein the contact angle is measured at an intersection between the metallic wetting liner and a straight line that extends tangent to an outer surface of the metal in the molten state in the via without crossing over the centerline, and the straight line is oriented toward the first surface of the monolithic substrate body.

2. The method of claim 1, further comprising, prior to the physically contacting step, applying an adhesion layer to an inner surface of the monolithic substrate body that extends from the first surface to the second surface.

3. The method of claim 2, further comprising the step of applying the metallic wetting liner to the adhesion layer prior to the melting step, such that the adhesion layer is disposed between the inner surface and the metallic wetting liner.

4. The method of claim 3, wherein the metallic wetting liner comprises at least one of copper, gold, a gold alloy, and a copper alloy.

5. The method of claim 3, wherein the adhesion layer and the metallic wetting liner are each devoid of tin.

6. The method of claim 2, wherein the adhesion layer comprises titanium or tantalum.

7. The method of claim 1, wherein the solidified metal defines an electrical path from the first surface to the second surface.

8. The method of claim 1, wherein the contacting step comprises placing a quantity of the metal in a solid state on the first surface of the substrate body such that the quantity of the metal in the solid state is in physical contact with the first surface of the monolithic substrate body.

9. The method of claim 8, further comprising the step of melting the metal in the solid state after the placing step, so as to transition the metal in the solid state to the metal in the molten state.

10. The method of claim 9, wherein the melting step comprises selectively applying an excitation device to the quantity of solid metal sufficient to cause the solid metal to reach a melting temperature that causes the solid metal to melt.

11. The method of claim 10, wherein the excitation device is a laser that directs a laser beam to the quantity of solid metal.

12. The method of claim 9, further comprising pre-heating the substrate body prior to the melting step.

13. The method of claim 9, wherein the melting step comprises inducing eddy currents in the metal in the solid state.

14. The method of claim 1, wherein the via has an aspect ratio of at least approximately five, wherein the aspect ratio is a ratio of a length of the via from the first surface to the second surface along a central axis with respect to a maximum cross-sectional dimension of the via along a direction perpendicular to the central axis.

15. The method of claim 1, wherein the contacting step comprises placing the substrate body in a bath of the metal in the molten state.

16. The method of claim 1, comprising the step of filling voids with a polymer, wherein the voids are defined by metal in the via.

17. The method of claim 1, further comprising the step of applying a redistribution layer to at least one or both of the first and second surfaces in electrical communication with the via.

18. The method of claim 1, wherein the metal is defined by a first mass of metal, the method further comprising the steps of:
- physically contacting a second mass of metal with the second surface of the monolithic substrate body,
- causing a quantity of the second mass of metal in a molten state to flow via capillary action from the second surface toward the first surface in the via; and
- solidifying the metal of the second mass of metal in the molten state in the via.

* * * * *